(12) United States Patent
Nguyen et al.

(10) Patent No.: US 10,978,818 B2
(45) Date of Patent: Apr. 13, 2021

(54) ELECTRONIC DEVICE FASTENER

(71) Applicant: SK hynix Inc., Gyeonggi-do (KR)

(72) Inventors: Lock Duc Nguyen, Morgan Hill, CA (US); Alex Jensen, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/520,271

(22) Filed: Jul. 23, 2019

(65) Prior Publication Data

US 2021/0028568 A1 Jan. 28, 2021

(51) Int. Cl.
*H01R 43/26* (2006.01)
*H01R 12/73* (2011.01)
*H05K 1/18* (2006.01)

(52) U.S. Cl.
CPC .............. *H01R 12/73* (2013.01); *H01R 43/26* (2013.01); *H05K 1/18* (2013.01); *H05K 2201/10189* (2013.01); *H05K 2201/10409* (2013.01); *H05K 2201/10424* (2013.01); *H05K 2201/2027* (2013.01); *H05K 2201/2036* (2013.01)

(58) Field of Classification Search
CPC ....... H05K 2201/10424; H05K 1/0433; H05K 2201/2027; H01R 12/88; H01R 12/73; H01R 43/26; G01R 3/00; H01L 23/4093; H01L 21/67271; G06F 11/2733
See application file for complete search history.

(56) References Cited

U.S. PATENT DOCUMENTS

| | | |
|---|---|---|
| 7,145,778 B2 | 12/2006 | DeLuga et al. |
| 7,768,789 B2 | 8/2010 | Ni |
| 8,305,103 B2 * | 11/2012 | Kang ................ G06F 11/2733 324/757.01 |
| 9,711,389 B2 * | 7/2017 | Kim ................ H01L 21/67271 |
| 2005/0026476 A1 * | 2/2005 | Mok ........................ G01R 3/00 439/81 |
| 2011/0176864 A1 * | 7/2011 | Shin ..................... G01R 1/0433 403/270 |
| 2018/0210517 A1 | 7/2018 | Yun |
| 2019/0304870 A1 * | 10/2019 | Boyd .................. H01L 23/4093 |
| 2019/0306985 A1 * | 10/2019 | Ferguson ............... H01R 12/88 |

FOREIGN PATENT DOCUMENTS

| | | |
|---|---|---|
| CN | 101425324 A | 5/2009 |
| KR | 200443263 Y1 | 1/2009 |
| KR | 100999565 B1 | 12/2010 |
| KR | 101677709 B1 | 11/2016 |

* cited by examiner

*Primary Examiner* — Jean F Duverne
(74) *Attorney, Agent, or Firm* — Kilpatrick Townsend & Stockton LLP

(57) ABSTRACT

Embodiments describe an electronic device fastener including a base link bar, and a pair of corner retaining features coupled to the base link bar. Each corner retaining feature includes a base being formed of a planar structure and having a base top surface, a support rail extending from a portion of the base top surface and having a support rail top surface, a fastening feature defined by surfaces of the base and support rail and comprising vacant space extending through the base and at least a portion of the support rail, a guide wall extending from a portion of the support rail top surface, a retaining protrusion extending from the guide wall toward a center line of the electronic device fastener, and a stopper positioned beside the base link bar and at back ends of the base, the support rail, the guide wall, and the base link bar.

20 Claims, 7 Drawing Sheets

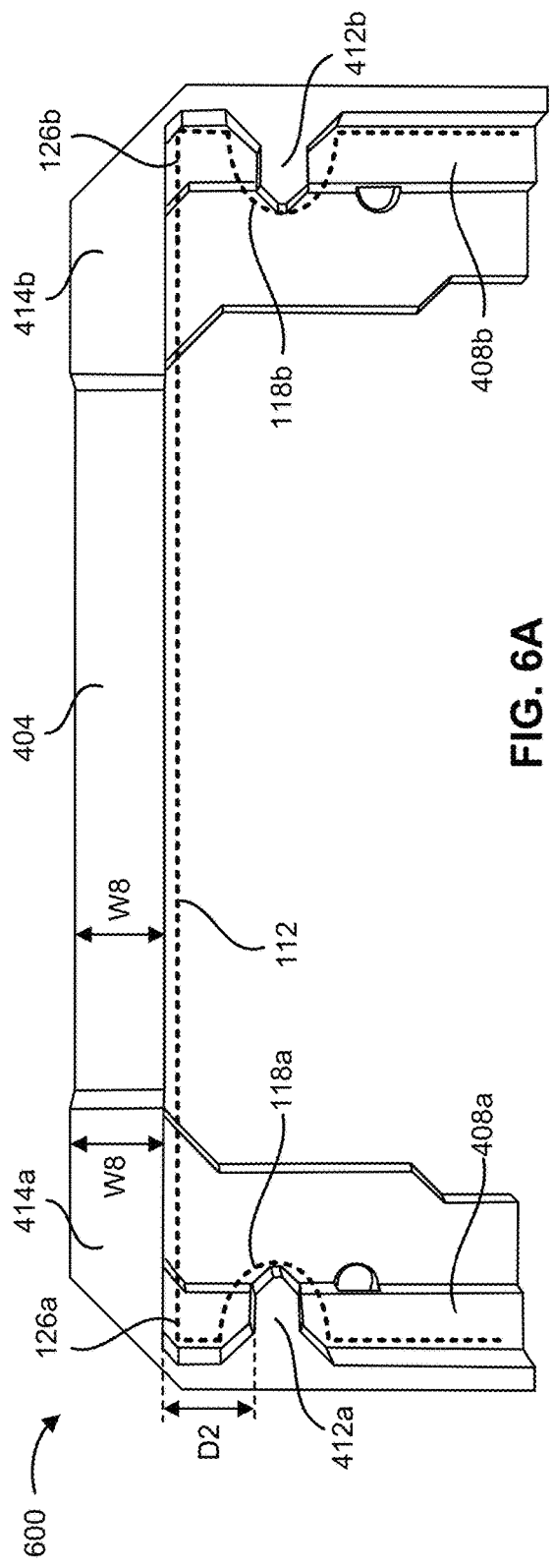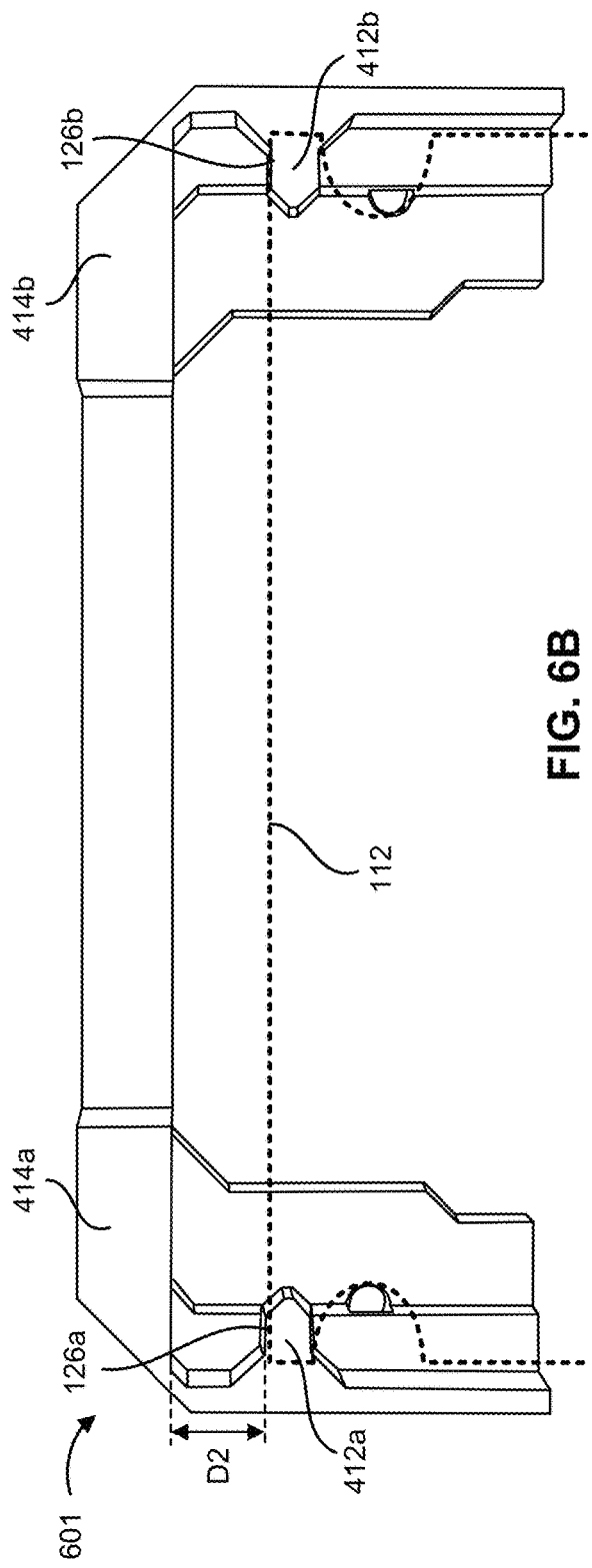

ELECTRONIC DEVICE FASTENER

BACKGROUND

Computer systems, such as desktop computers, servers, laptops, and the like use electronic devices, such as data storage devices, to operate. Some of these electronic devices include read-only memory (ROM) such as hard disk drives (HDDs) that can be constructed using solid state technology, which are known as solid state drives (SSDs). During manufacturing, such devices often need to be tested to ensure proper operation before being packaged and sold to the consumer. A manufacturer can test several tens, hundreds, or even thousands of such storage devices in a given day during full-scale production. And typically, the electronic devices are tested in skeleton form without its final protective case. In such situations, the unfinished product may be difficult to secure to an interposer, e.g., testing board, and may be prone to movement especially during handling of the product when connected to the interposer. When moved, the electronic device may be improperly connected to the testing board and my result in a partial or complete disconnection from the testing board. Some solutions rely on adhesives, such as strips of tape, to keep the electronic device from moving out of position, but such solutions are unreliable, unrepeatable, and time consuming. These shortcomings can increase the time it takes to test and debug manufactured product, thereby decreasing production volume as well as increasing testing cost.

SUMMARY

Some embodiments of the disclosure pertain to temporary electronic device fasteners that enable electronic devices to be easily and quickly secured to a testing board in a highly repeatable manner. The electronic device fastener can be attached using mechanical attachment mechanisms that already exist on the testing board, and can provide structural features that confine the electrical device in an optimal position for testing. Furthermore, the electronic device fastener can include features that allow the electronic device to easily disconnect and be removed from the testing board. Such features simplify the testing process and improve the overall testing speed, thereby saving time and cost.

In some embodiments an electronic device fastener includes a base link bar, and a pair of corner retaining features coupled to the base link bar and forming a monolithic structure with the base link bar. Each corner retaining feature includes a base being formed of a planar structure and having a base top surface having a base width, a support rail extending from a portion of the base top surface and having a support rail top surface having a support rail width, a fastening feature defined by surfaces of the base and support rail and comprising vacant space extending through the base and at least a portion of the support rail, a guide wall extending from a portion of the support rail top surface, a retaining protrusion extending from the guide wall toward a center line of the electronic device fastener, the retaining protrusion being positioned a first distance away from the support rail, and a stopper positioned beside the base link bar and at back ends of the base, the support rail, the guide wall, and the base link bar.

The pair of corner retaining features can be mirror images of one another. The retaining protrusion can be positioned a second distance away from the stopper. A top surface of the retaining protrusion can be coplanar with a top surface of the guide wall. The retaining protrusion can include a first width and a second width narrower than the first width so that the retaining protrusion has a tapered profile. The first width can be for a region closest to the guide wall, and the second width can be for a region farthest from the guide wall. The base width can be different from the support rail width. The base width can be greater than the support rail width. The fastening feature can be a screw hole. The support rail top surface can be substantially planar.

In certain embodiments, an electronic device system includes and interposer and an electronic device. The interposer can include a interposer substrate comprising at least two mounting holes, and an interposer connector mounted on the interposer substrate. The electronic device can include an electronic device substrate comprising at least two recesses, an electronic device connector mounted on the electronic device substrate, the electronic device fastener configured to electrically couple with the interposer connector, and an electronic device fastener mounted on the interposer substrate by way of the at least two mounting holes and configured to couple the electronic device to the interposer. The electronic device fastener can include a base link bar and a pair of corner retaining features coupled to the base link bar and forming a monolithic structure with the base link bar. Each corner retaining feature can include a base being formed of a planar structure and having a base top surface having a base width, a support rail extending from a portion of the base top surface and having a support rail top surface having a support rail width, a fastening feature defined by surfaces of the base and support rail and comprising vacant space extending through the base and at least a portion of the support rail, a guide wall extending from a portion of the support rail top surface, a retaining protrusion extending from the guide wall toward a center line of the electronic device fastener, the retaining protrusion being positioned a distance away from the support rail, and a stopper positioned beside the base link bar and at back ends of the base, the support rail, the guide wall, and the base link bar.

The pair of corner retaining features can be mirror images of one another. The retaining protrusion can be positioned a second distance away from the stopper. A top surface of the retaining protrusion can be coplanar with a top surface of the guide wall. The retaining protrusion can include a first width and a second width narrower than the first width so that the retaining protrusion has a tapered profile. The first width can be for a region closest to the guide wall, and the second width is for a region farthest from the guide wall.

In some embodiments, a method for connecting an electronic device to an interposer with an electronic device fastener includes contacting an electronic device connector to an interposer connector, pressing the electronic device into a support rail of the electronic device fastener by having a recess of a substrate of the electronic device bypass a retaining feature of the electronic device fastener, and sliding the electronic device along at least a portion of the support rail of the electronic device fastener to engage contact pins of the electronic device connector with contact pints of the interposer connector.

The method can further include positioning the electronic device at an angle with respect to the interposer. Pressing the electronic device into a support rail of the electronic device fastener can position the electronic device planar to the interposer so that the electronic device connector is aligned with the interposer connector. The electronic device can be prevented from moving upward, downward, and side-to-side once the electronic device fastener is engaged with the interposer connector.

A better understanding of the nature and advantages of embodiments of the present disclosure may be gained with reference to the following detailed description and the accompanying drawings. It is to be understood, however, that each of the figures is provided for the purpose of illustration only and is not intended as a definition of the limits of the scope of the disclosure. Also, as a general rule, and unless it is evident to the contrary from the description, where elements in different figures use identical reference numbers, the elements are generally either identical or at least similar in function or purpose.

BRIEF DESCRIPTION OF THE DRAWINGS

FIGS. 6A and 6B are simplified top-down view illustrations of the electronic device fastener in FIG. 4, according to some embodiments of the present disclosure.

DETAILED DESCRIPTION

Figure 1:
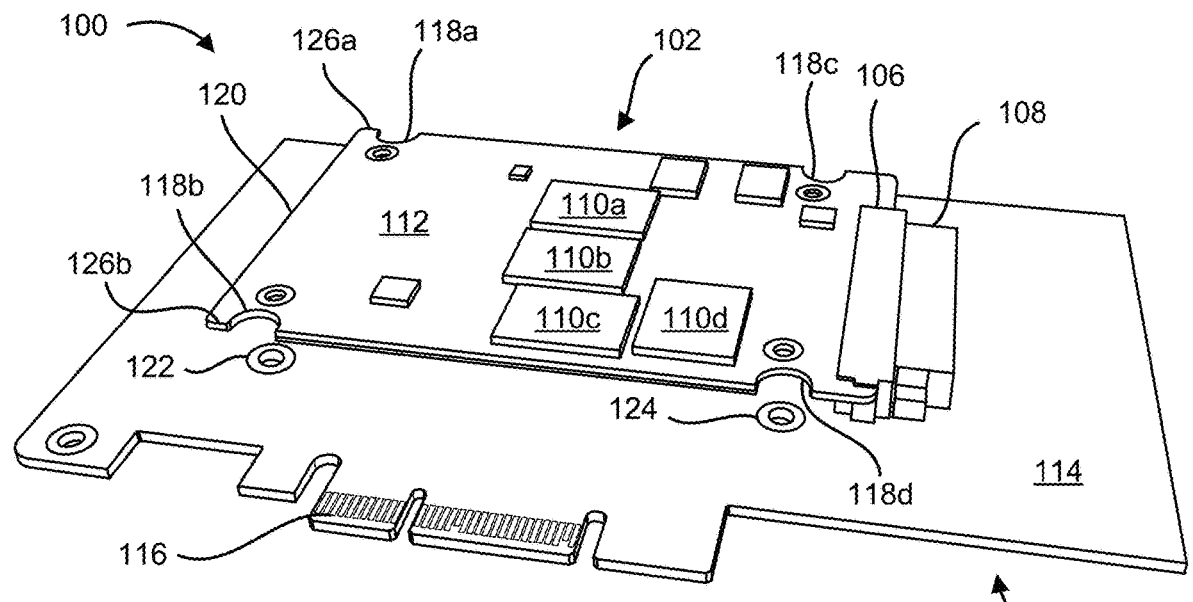
FIG. 1 is an example perspective view of an electronic device system including an electronic device attached to an interposer without use of an electronic device fastener.

Certain aspects and embodiments of this disclosure are provided below. Some of these aspects and embodiments may be applied independently and some of them may be applied in combination as would be apparent to those of skill in the art. In the following description, for the purposes of explanation, specific details are set forth in order to provide a thorough understanding of embodiments. However, it will be apparent that various embodiments may be practiced without these specific details. The figures and description are not intended to be restrictive.

The ensuing description provides examples, and is not intended to limit the scope, applicability, or configuration of the disclosure. Rather, the ensuing description of the exemplary embodiments will provide those skilled in the art with an enabling description for implementing an exemplary embodiment. It should be understood that various changes may be made in the function and arrangement of elements without departing from the spirit and scope of the present disclosure as set forth in the appended claims.

The following detailed description together with the accompanying drawings in which the same reference numerals are sometimes used in multiple figures to designate similar or identical structures structural elements, provide a better understanding of the nature and advantages of the present disclosure.

Embodiments of the disclosure pertain to an electronic device fastener that enables an electronic device to easily attach to, and detach from, an interposer so that its position when attached is optimal for maintaining electrical connection during testing. The electronic device can be an SSD formed of packaged electrical components, e.g., computer chips, mounted on a substrate, e.g., a printed circuit board (PCB). The PCB can include a network of conductive traces for electrically coupling the packaged electrical components together. When attached, a connector of the electronic device can be engaged with a connector of the interposer so that electrical communication, such as test sequences, can occur between the electronic device and the interposer, or between the electronic device and a test computer through the interposer. The electronic device fastener (1) allows the electronic device to be easily attached to the interposer, (2) secures the electronic device to the interposer in an ideal position for preventing electrical disconnection, and (3) allows the electronic device to be easily detached from the interposer, thereby improving the testing process, cost, and reliability over other testing processes that do not use the electronic device fastener.

FIG. 1 is an example perspective view of an electronic device system 100 including an electronic device 102 attached to an interposer 104 without use of an electronic device fastener. Electronic device 102 can be coupled to an interposer 104 via an electronic device connector 106 that is mated with an interposer connector 108. Electronic device connector 106 and interposer connector 108 can each be any suitable multi-pin connector suitable for making electrical communication with an external device. In addition to connector 106, electronic device 102 can also include a plurality of electronic devices 110a-d, such as a processor, memory device, integrated circuit, etc., mounted on an electronic device substrate 112, such as a PCB. And, interposer 104 can include an interposer substrate 114, e.g., PCB, and interposer connector interface 116 extending from an edge of interposer substrate 114. When connector 106 is mated with connector 108, electronic device 102 can electrically communicate with interposer 104, and in some instance, electronic device 102 can electrically communicate with an external device (not shown) through interposer connector interface 116. In some embodiments, interposer 104 is a peripheral component interconnect express (PCIe) device, and the combination of electronic device 102 and interposer 104 can form an add-in card (AIC).

Substrate 112 of electronic device 102 can have certain features that enable it to be housed within a case and mounted to an interconnection board when packaged in final product form. For example, substrate 112 can include recesses 118a-d that are positioned on opposite edges of substrate 112 and near the four corners of substrate 112. Recesses 118a-d can provide an avenue through which screws can pass to firmly secure a housing of electronic device 102 to the interconnection board. For instance, screws can pass through recesses 118a-d and fasten into mounting holes 122 and 124. Mounting holes 122 and 124 may be two of four mounting holes positioned to comply with SFF-8201 v3.4 for the purpose of mounting solid state drives with cases via their mounting holes. An electronic device fastener can be configured to utilize two of those four mounting holes to perform functions, as will be discussed further herein. As further shown in FIG. 1, recesses 118a-b positioned near edge 120 opposite from the edge where connector 106 is positioned can cause tabs 126a-b to be formed at corners of substrate 112 at edge 120. Tabs 126a-b can be cantilever structures that are defined by the corners of substrate 112 and portions of the surfaces of recesses 118a-b.

Because electronic device connector 106 is positioned at one edge of electronic device 102, when electronic device connector 106 is communicatively coupled to interposer connector 108, edge 120 of substrate 112 may be freely dangling like a diving board. This connected position may be susceptible to movement that can cause electronic device 102 to be improperly connected, if not completely disconnected, from interposer 104. For instance, edge 120 of electronic device 102 can move upward, downward, and/or side-to-side, where each directional movement of edge 120 can cause stress on the physical connection between electronic device connector 106 and interposer connector 108 that can lead to improper connections and/or complete disconnections.

Figure 2:
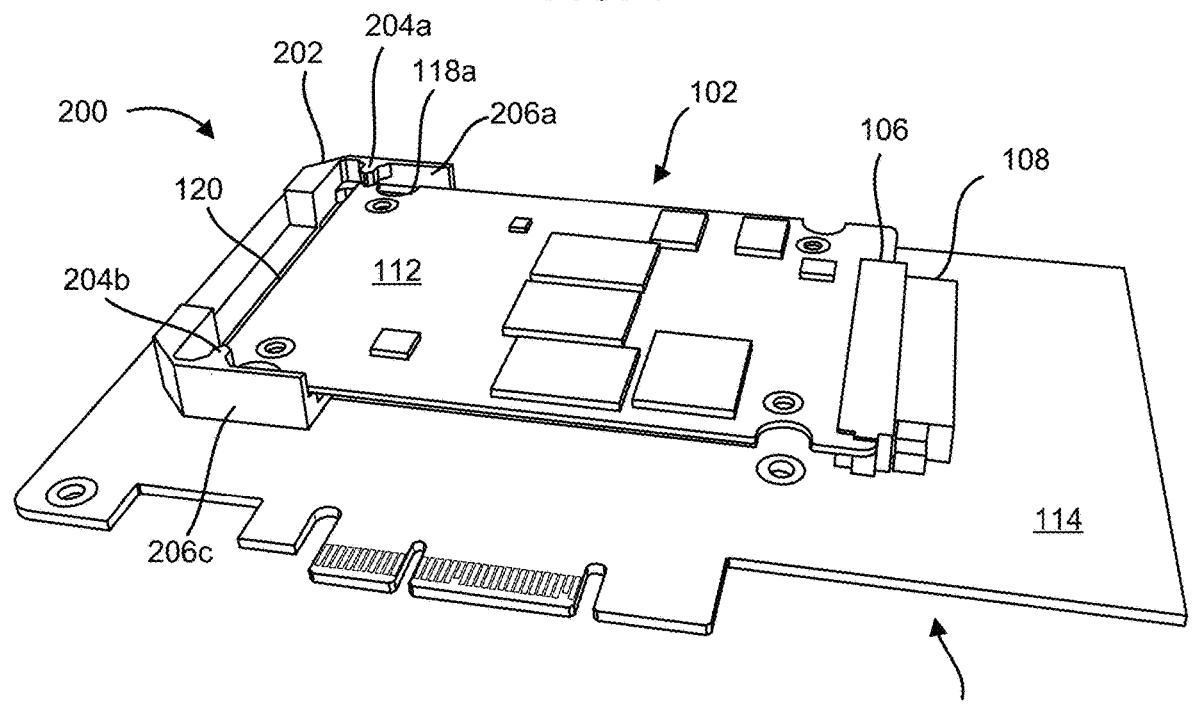
FIG. 2 is an example perspective view of an electronic device system including an electronic device securely attached to interposer by an electronic device fastener, according to some embodiments of the present disclosure.

According to some embodiments of the present disclosure, an electronic device fastener can be implemented to secure edge 120 in place when electronic device 102 is communicatively coupled to interposer 104. FIG. 2 is an example perspective view of an electronic device system 200 including electronic device 102 securely attached to interposer 104 by an electronic device fastener 202, according to some embodiments of the present disclosure. Electronic device fastener 202 can have structural features that hold substrate 112 in place so that end 120 of substrate 112 cannot move substantial distances in the vertical and horizontal directions to cause disconnections between electronic device connector 106 and interposer connector 108. For instance, electronic device fastener 202 can include retaining protrusions 204a-b, guide walls 206a-b, and a support rail (not shown) on which substrate 112 can rest to prevent end 120 of electronic device 102 from moving horizontally and vertically, as will be discussed further herein. In some instances, electronic device fastener 202 includes attachment features that allow it to be fastened to substrate 114 of interposer 104 via screws through corresponding mounting holes, e.g., mounting hole 122 and another mounting hole not seen from the perspective shown in FIG. 2 but near recess 118, as will be discussed further herein. Electronic device fastener 202 can be formed of any suitable stiff and budget-friendly material, such as poly(methyl methacrylate) (PMMA) or any other type of plastic.

Figure 3A:
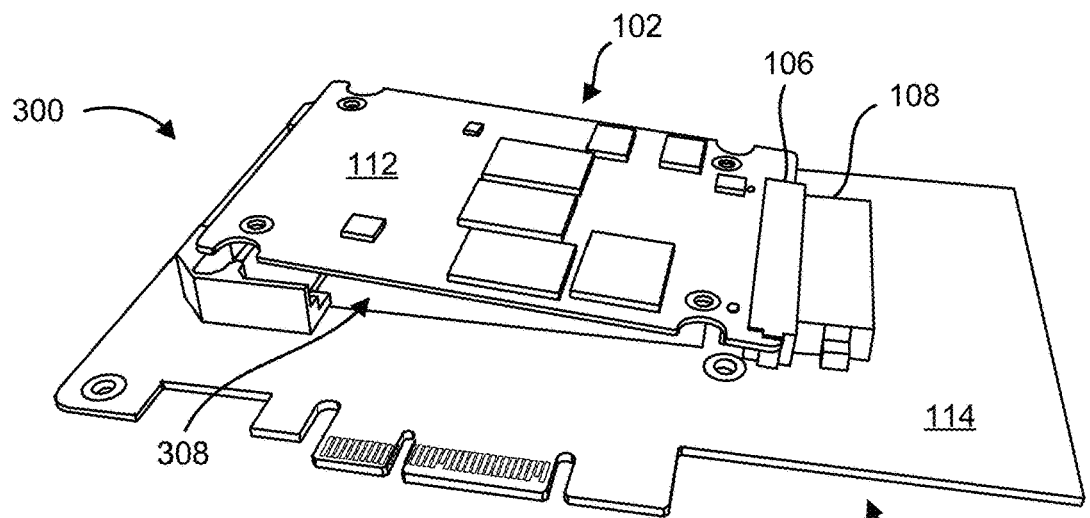
FIGS. 3A-3C are a series of illustrations showing different instances of time of during a method is being performed to attach an electronic device to an interposer using an electronic device fastener, according to some embodiments of the present disclosure is, according to some embodiments of the present disclosure.
Figure 3B:
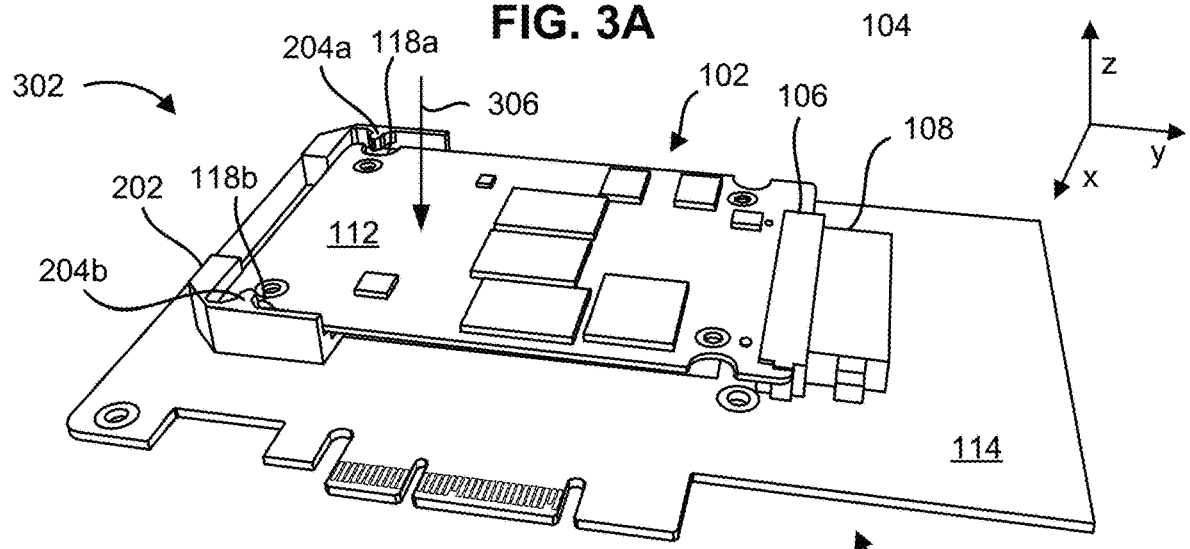
Figure 3C:
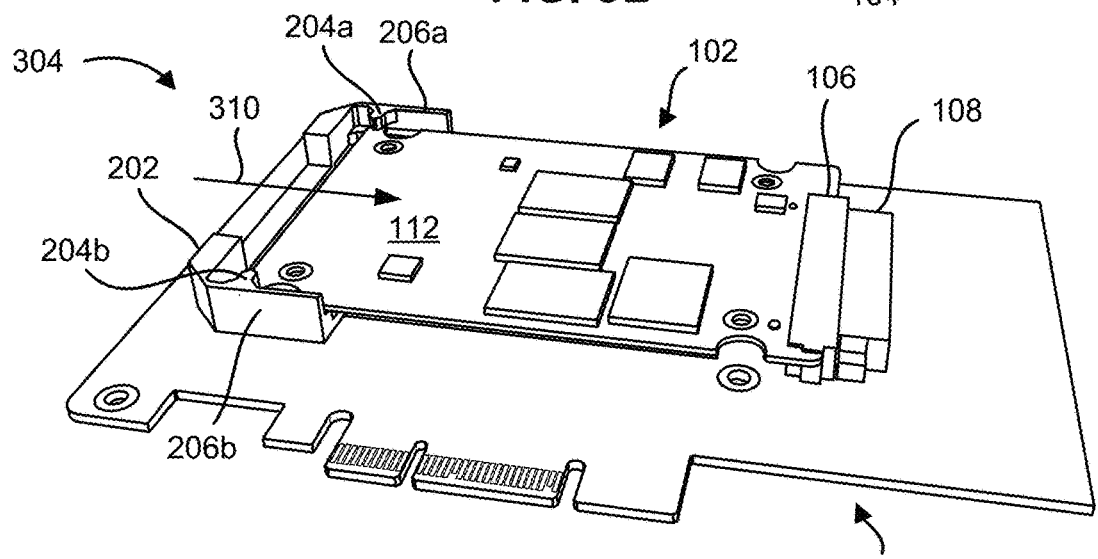

In some embodiments, the structural configuration of electronic device fastener 202 can allow easy connection and disconnection of electronic device 102 with interposer 104. FIGS. 3A-3C are a series of illustrations showing different instances of time of during a method is being performed to attach electronic device 102 to interposer 104 using electronic device fastener 202, according to some embodiments of the present disclosure. At instance 300 shown in FIG. 3A, electronic device 102 can be brought into contact with interposer 104 so that electronic device connector 106 and interposer connector 108 are roughly aligned with one another but are not fully connected. At this time, substrate 112 of electronic device 102 may be positioned at an angle with respect to substrate 114 of interposer 114.

Then, at instance 302 shown in FIG. 3B, downward force 306 can be applied to electronic device 102 to cause substrate 112 of electronic device 102 to be substantially parallel to substrate 114 of interposer 104. Substrate 112 can pivot downward at a point between connectors 106 and 108 so that connectors 106 and 108 remain in contact during the maneuver. As can be seen with reference to FIG. 3B, parts of electronic device fastener 202, e.g. retaining protrusions 204a-b, can pass through corresponding recesses 118a-b to allow substrate 112 to rest on the support rails (not shown) of electronic device fastener 202. In this position, retaining protrusions 204a-b may be positioned above substrate 112 in the z-dimension, while substrates 112 and 114 are substantially parallel along the x- and y-dimensions.

Then, at instance 304 shown in FIG. 3C, lateral force 310 can be applied to electronic device 102 that causes electrical device connector 106 to engage and electrically couple with interposer connector 108. Lateral force 310 can cause substrate 112 to slide laterally along the support rails of electronic device fastener 202 in the y-direction until tabs 126a-b (covered and not visible in FIG. 3C but can be seen in FIG. 1) are positioned between retaining protrusions 204a-b and the support rail. That way, end 120 of electronic device 102 may be substantially restrained in the z-direction. Furthermore, guide walls 206a-b can be positioned on opposite edges of substrate 112 to restrain end 120 of electronic device 102 in the lateral, x-direction to prevent it from moving side-to-side. As can be appreciated with reference to FIGS. 3A-3C, electronic device 102 can be easily attached and electrically coupled to interposer 104.

Although the description of FIGS. 3A-3C reference movement of electronic device 102 instead of interposer 104, it can be understood that such movement is relative and that corresponding movements of interposer 104 can occur while electronic device 102 is stationary, or both electronic device 102 and interposer 104 can be moved simultaneously to effectuate the attachment sequence shown in FIGS. 3A-3C. Furthermore, although FIGS. 3A-3C illustrate electronic device 102 attaching to interposer 104, it is to be appreciated that detaching electronic device 102 from interposer 104 can be performed by reversing the movements of electronic device 102. For instance, to detach electronic device 102 from interposer 104, electronic device 102 can be subject to lateral force in a direction opposite of force 310 can be applied to disengage electronic device connector 106 from interposer connector 108, and vertical force in a direction opposite of force 306 can be applied to lift electronic device 102 up and away from interposer 104. Thus, electronic device fastener 202 can enable easy and fast attachment and detachment of electronic device 102 with interposer 104.

Figure 4:
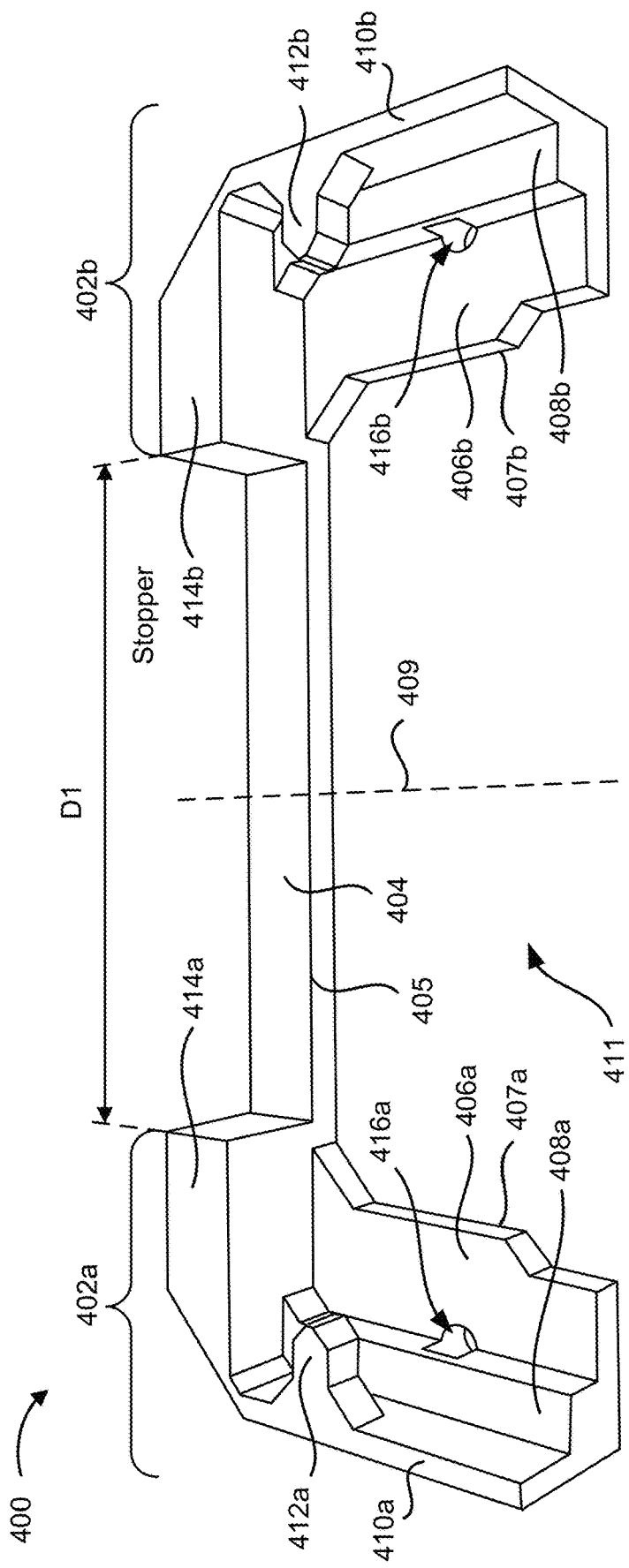
FIG. 4 is a simplified perspective top-view illustration of an example electronic device fastener, according to some embodiments of the present disclosure.
Figure 5:
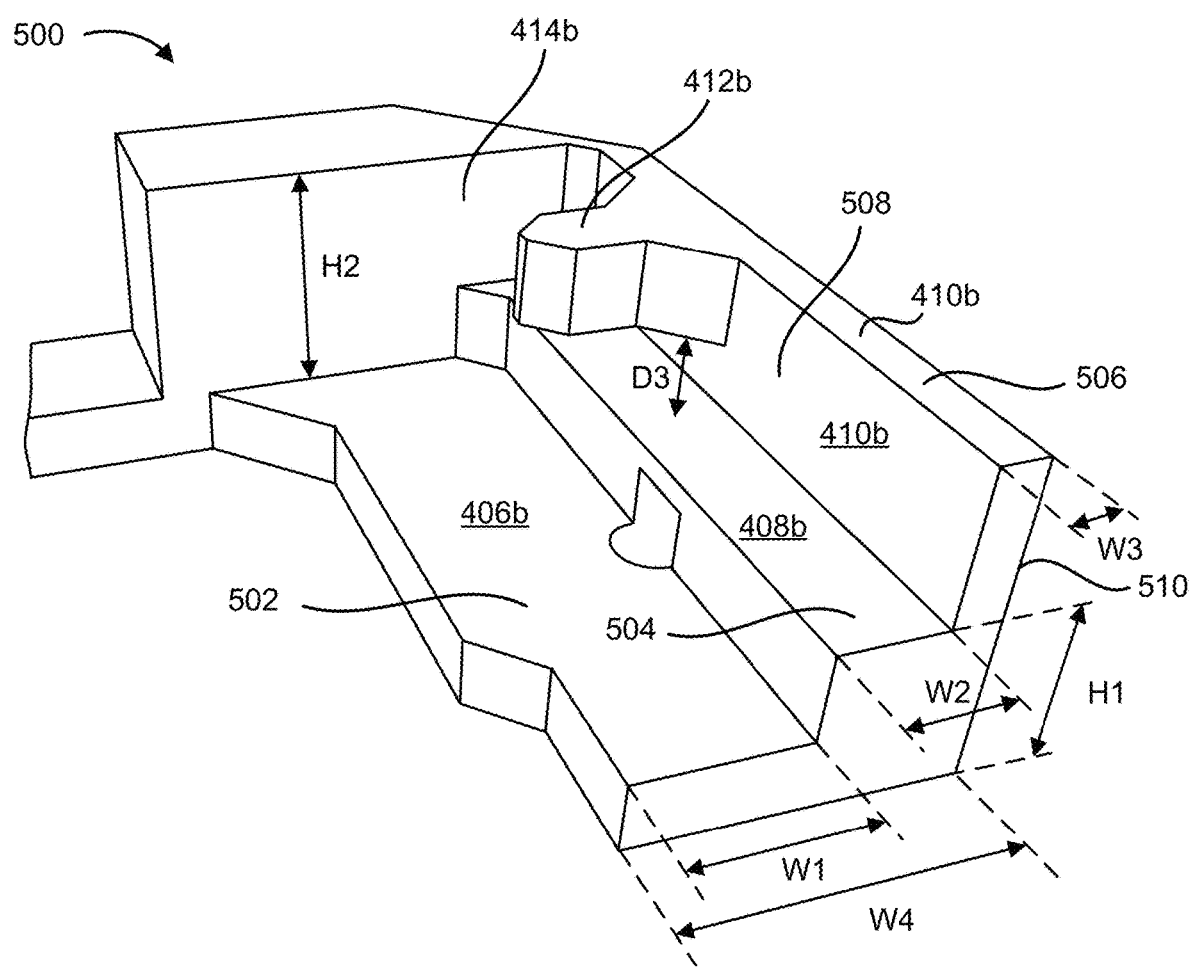
FIG. 5 is a simplified close-up perspective view illustration of a corner retaining feature of the electronic device fastener in FIG. 4, according to some embodiments of the present disclosure.
Figure 7:
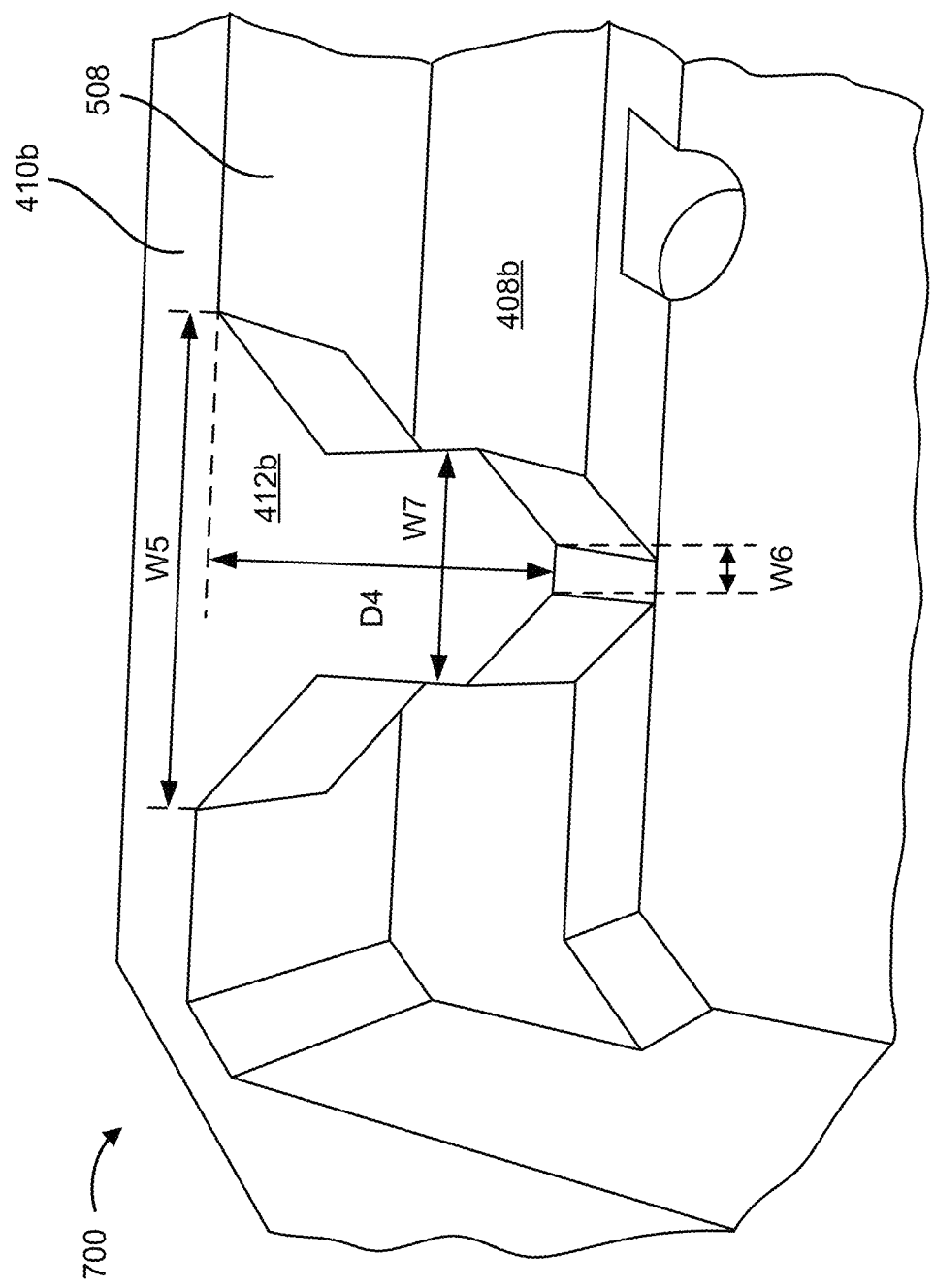
FIG. 7 is a simplified close-up perspective view illustration of a retaining protrusion of the electronic device fastener in FIG. 4, according to some embodiments of the present disclosure.
Figure 8:
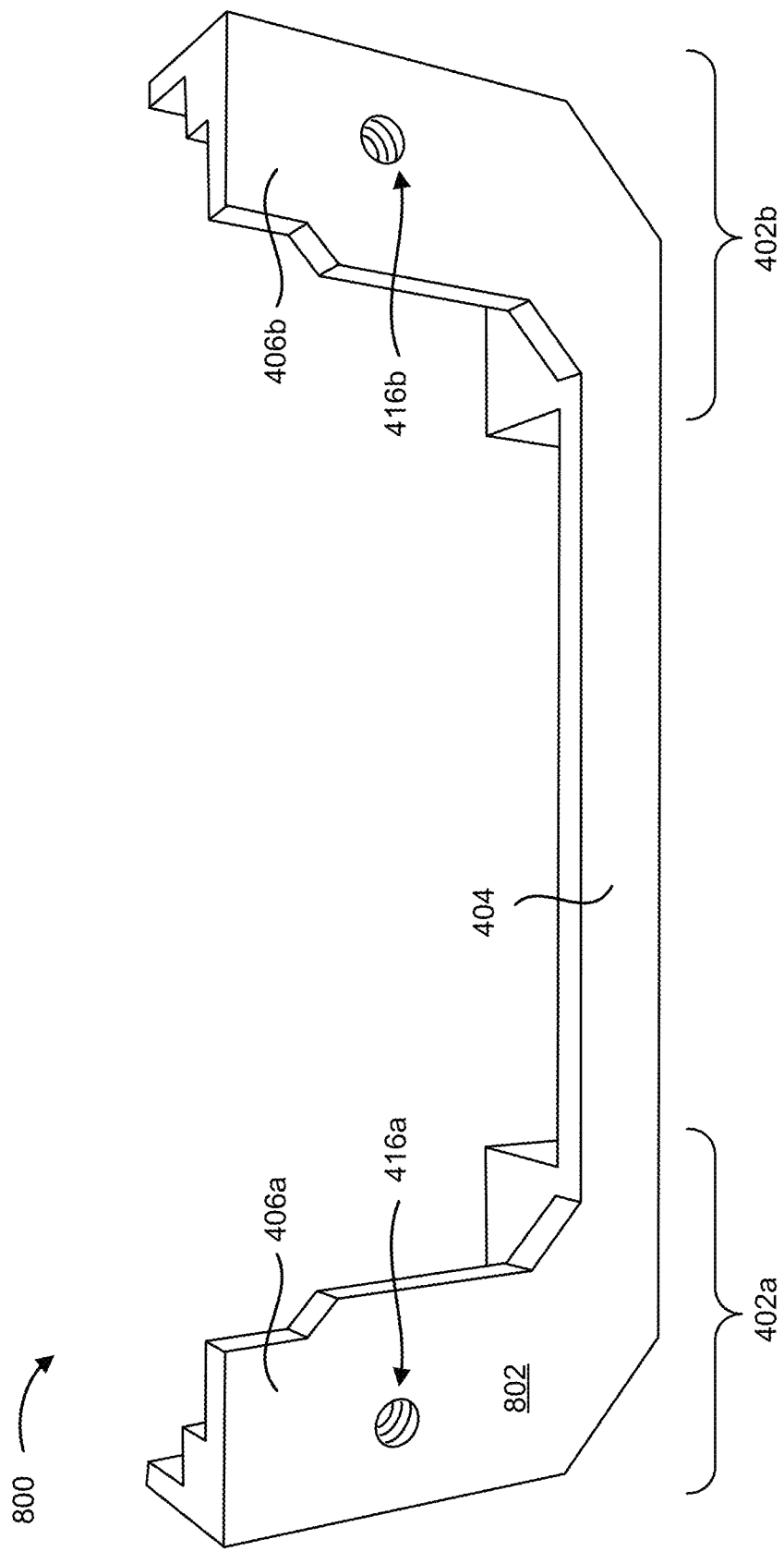
FIG. 8 is a simplified perspective bottom-view illustration of the electronic device fastener in FIG. 4, according to some embodiments of the present disclosure.

Details of the structure of an electronic device fastener according to embodiments of the present disclosure are discussed further herein with respect to FIGS. 4-8. Specifically, FIG. 4 is a simplified perspective top-view illustration of an example electronic device fastener 400, FIG. 5 is a simplified close-up perspective view illustration 500 of a corner retaining feature of electronic device fastener 400, FIGS. 6A-6B are simplified top-down view illustrations 600 and 601 of electronic device fastener 400, FIG. 7 is a simplified close-up perspective view illustration 700 of a retaining protrusion of electronic device fastener 400, and FIG. 8 is a simplified perspective bottom-view illustration 800 of electronic device fastener 400, according to some embodiments of the present disclosure. Discussion of the structural details of electronic device fastener 400 may briefly reference FIGS. 5-8 while each component of electronic device fastener 400 is described.

As shown in FIG. 4, electronic device fastener 400 can include a pair of corner retaining features 402a-b and a base link bar 404 configured to couple together pair of corner retaining features 402a-b. Base link bar 404 can be positioned between corner retaining features 402a-b, and can be configured to hold them together as a single structure and provide structural rigidity to the overall structure to keep pair of corner retaining features 402a-b substantially coplanar. Thus, base link bar 404 can be configured to have a thickness sufficient to provide such structural functionality, as well as provide enough clearance space to allow access to the underside of the electronic device. For instance, the thickness of base link bar 404 can range between 0.05 inches and 0.1 inches, such as 0.08 inches in some implementations. As shown in FIG. 4, pair of corner retaining features 402a-b can be mirror images of one another, meaning the structure of corner retaining feature 402a can be substantially similar to the structure of corner retaining feature 402b but in a reverse arrangement. In some embodiments, pair of corner retaining features 402a-b and base link bar 404 together can be configured as a monolithic structure.

Each corner retaining feature 402a-b can include a base 406a-b, a support rail 408a-b, and a guide wall 410a-b. Base 406a-b can be a substantially planar structure that is configured to (1) make physical contact with an interposer, e.g., interposer 104 in FIGS. 1-2, and 3A-3C when electronic device fastener 400 is installed on the interposer, and (2) allow electronic device fastener 400 to rest flat the interposer. Base 406a-b can include an inner edge 407a-b that faces toward a center line 409 of electronic device fastener 400. In some embodiments, inner edges 407a and 407b are positioned away from one another so that, when combined with an inner edge 405 of base link bar 404, inner edges 407a-b and 405 can define a cavity 411. Cavity 411 can allow electronic devices mounted on the substrate of the electronic device to be accessed through a corresponding opening in the interposer, such as an opening 308 in interposer 104 shown in FIG. 3A. With reference to FIG. 5, base 406a-b can have a top surface 502 that has a width W1. In some embodiments, width W1 is wide enough to provide a stable base for electronic device fastener 400, while not being too wide as to encroach into a clearance space of the opening in the interposer. As an example, width W1 can range between 0.1 inches and 0.3 inches, such as 0.185 inches in some implementations. The thickness of base 406b can be similar to the thickness of base link bar 404 for providing structural rigidity to electronic device fastener 400.

Support rail 408a-b can extend from a portion of top surface 502 of base 406a-b and have a substantially planar top surface 504 for providing a platform on which a substrate for an electronic device can be positioned. For instance, substrate 112 of electronic device 102 in FIG. 2 can (1) rest on support rails 408a-b when substrate 112 is stationary, e.g., when connector 106 of electronic device 102 is engaged with connector 108 of interposer 104 as discussed herein with respect to FIG. 3C, or (2) slide on support rails 408a-b when substrate 112 during the act of engaging, e.g., when substrate 112 is moving toward connector 108 of interposer 104, to engage connector 106 of electronic device 102 with connector 108 of interposer 104 as discussed herein with respect to FIG. 3B. Support rail 408a-b can also provide a barrier to prevent electronic device 102 from bending downward toward interposer 104 during engaging and after engagement has been made between the connectors of the electronic device and the interposer. Top surface 504 of support rail 408a-b can have a width W2 that is wide enough to provide a stable base component for supporting movement of the electronic device component, while not being too wide so that it interferes with/runs into electronic components on the electronic device. As an example, width W2 can range between 0.1 inches and 0.15 inches, such as 0.115 inches in some implementations. The thickness of support rail 408a-b can be specifically selected so that the height H1 of top surface 504 measured from the bottom surface of base 406a-b is suitable for positioning the electronic device substantially planar to the interposer while substantially aligning the electronic device connector with the interposer connector. Thus, the thickness of support rail 408a-b can range between 0.5 inches and 0.3, inches, particularly 0.18 inches in some embodiments. With this thickness, height H1 can be sufficient for providing support for two-sided connectors and one-sided connectors.

Guide wall 410a-b can extend from a portion of top surface 504 of support rail 408a-b and have a substantially planar inner surface 508 that faces toward the center line of the electronic device fastener, e.g., center line 409 in FIG. 4. Inner surface 508 of guide walls 410a-b can confine the electronic device in place to prevent it from sliding side-to-side during engaging and after engagement has been made between the connectors of the electronic device and the interposer. In some embodiments, outer edges of base 406a-b, support rail 408a-b, and guide wall 410a-b together can be coplanar and form outer side edges 510 of electronic device fastener 400. Guide wall 410a-b can have a width W3 that is sufficient to resist lateral movement of the electronic device. For instance, width W3 can be at least 0.025 inches to 0.075 inches, such as 0.05 inches in some particular embodiments.

With reference back to FIG. 4, each corner retaining feature 402a-b can also include a stopper 414a-b directly coupled to base link bar 404 and extending from back ends of base 406a-b, supper trail 408a-b, and guide wall 410a-b. Stopper 414a-b can provide a barrier to prevent the electronic device from being pulled too far away from the connector of the interposer when detaching the electronic device from the interposer. For example, when lateral force is applied in a direction opposite to that of force 310 in FIG. 3C, too much uncontrolled force when electronic device fastener 202 is absent can cause electronic device 102 to over-travel and/or cause electrical components on device 102 to snag on parts of interposer 104. Thus, stopper 414a-b can block electronic device 102 from over-traveling when detaching from interposer 104. The distance D1 between stoppers 414a and 414b can be configured so that inner surfaces 415a-b of guide walls 410a-b are positioned close to the edges of a substrate of the electronic device to prevent the electronic device from being able to substantially slide horizontally from side-to-side. Distance D1 can dictate the length of base link bar 404. The width of stopper 414a-b can be configured to be wide enough to withstand impact forces generated during removal of the electronic device; and, in some embodiments, the width of stopper 414a-b can be substantially similar to the width of base link bar 404. For instance, as shown in FIG. 6A, base link bar 404 and stoppers 414a-b can have a width W8 ranging between 0.1 inches to 0.3 inches, such as 0.2 inches in some particular embodiments. Furthermore, as shown in FIG. 5, stopper 414a-b can have a height H2 that allows stopper 414a-b to block backward travel of the electronic device. Height H2 of stopper 414a-b can range between 0.2 inches to 0.35 inches, such as 0.27 inches in some particular embodiments.

In some embodiments, with reference back to FIG. 4, each corner retaining feature 402a-b can also include a retaining protrusion 412a-b that extends from an upper region of guide wall 410a-b. Retaining protrusion 412a-b can extend toward center line 409 so that when the electronic device is engaged with the interposer, retaining protrusion 412a-b can act as a barrier to prevent the electronic device from bending upward away from the interposer during engaging and after engagement has been made between the connectors of the electronic device and the interposer. For instance, with reference to FIG. 6A, retaining protrusions 412a-b can be positioned a distance D2 away from stoppers 414a-b so that portions of the substrate of the electronic device, e.g., tabs 126a-b of substrate 112 of electronic device 102 whose silhouette is shown by a series of dashed lines, can move between retaining protrusion 412a-b and stopper 414a-b when downward force 306 is applied as discussed herein with respect to FIG. 3B. Because retaining protrusions 412a-b are configured to fit within recesses 118a-b, distance D3 may not be too long or too short or else it may prevent the electronic device from being able to make contact with support rail 408a-b. In some embodiments, distance D3 can range between 0.1 inches and 0.3 inches, such as 0.195 inches in some particular embodiments In addition to be positioned a distance D2 away from support rail 408a-b, with reference back to FIG. 5, retaining protrusion 412a-b can be positioned a distance D3 away from support rail 408a-b so that portions of the substrate of the electronic device, e.g., tabs 126a-b and regions of the substrate of the electronic device near its outer side edges, can move between retaining protrusion 412a-b and support rail 408a-b when lateral force 310 is applied as discussed herein with respect to FIG. 3C. This interaction can be better understood with brief reference to FIG. 6B. As shown in FIG. 6B, the lateral force can cause substrate 112 to shift downward so that retaining protrusion 412a-b can overlap with tabs 126a-b to confine electronic device in the z-direction and prevent it from bending too far upward, which can cause the connectors, e.g., connectors 106 and 108 in FIG. 2, to disconnect form one another. D3 can be approximately equal to the thickness of the substrate of the electronic device, such as the thickness of a PCB. In some embodiments, D3 is slightly larger than the thickness of a PCB so that the electronic device can freely slide along support rail 408a-b, but not too large as to provide too much space for the electronic device to deflect upward and cause the connectors to disconnect from one another. As an example, distance D3 can range between 0.05 inches and 0.1 inches, such as 0.07 inches in some particular embodiments.

Retaining protrusion 412a-b can also extend a distance away from guide rail 410a-b so that retaining protrusion 412a-b can sufficiently prevent the electronic device from bending upward. As an example, with reference to FIG. 7, retaining protrusion 412a-b can extend a distance D4 from inner surface 508 of guide rail 410a-b. Distance D4 may be less than the depth of a recess, e.g., recess 118a-b of the substrate 112 in FIG. 1, so that the substrate can bypass retaining protrusion 412a-b and rest on support rail 408a-b. However, distance D4 may not be too short where it is ineffective in preventing the substrate from bending upward. As an example, distance D4 can range between 0.1 inches and 0.3 inches, such as 0.19 inches in some particular embodiments.

As shown in FIG. 7, retaining protrusion 412a-b can have a top surface that is coplanar with a top surface of guide wall 410a-b. Furthermore, retaining protrusion 412a-b can have a tapered profile where its base width W5 closest to guide wall 410a-b is wider than its end width W6. In some instances, retaining protrusion 412a-b can have an intermediate width W7 positioned between its base width W5 and end width W6. Widths W5, W6, and W7 may be designed to be wide enough to retain the substrate of the electronic device in the upward direction, but not too wide so that it prevents the substrate from being able to bypass retaining protrusion 412a-b and rest on support rail 408a-b. As an example, W5 can range between 0.1 inches to 0.4 inches, such as 0.24 inches in some particular embodiments, W6 can range between 0.01 inches to 0.05 inches, such as 0.02 inches in some particular embodiments, and W7 can range between 0.05 inches and 0.15 inches, such as 0.1 inches in some particular embodiments.

Although FIGS. 4, 5, 6A-6B, and 7 illustrate retaining protrusions 412a-b as having a tapered profile, embodiments are not limited to such configurations. Some electronic device fasteners can have retaining protrusions that are configured with other profiles, such as rectangular, ellipsoid, or any other type of profile suitable for retaining the substrate of the electronic device in the upward direction. Furthermore, although FIGS. 4, 5, 6A-6B, and 7 illustrate retaining protrusions 412a-b as having beveled corners, embodiments are not so limited. Other embodiments can have retaining protrusions that have angled or rounded corners without departing from the spirit and scope of the present disclosure.

With reference back to FIG. 4, corner retaining feature 404a-b can also include a fastening feature 416a-b for allowing electronic device fastener 400 to be secured to the interposer to provide the fastening function for the electronic device as discussed herein. Fastening feature 416a-b can be vacant space, such as a threaded hole, in which a screw can fit to mechanically fix electronic device fastener 400 to the interposer, e.g., electronic device fastener 202 with respect to interposer 104 as shown in FIG. 2. Portions of base 406a-b and support rail 408a-b can include contours that define the vacant space that forms fastening feature 416a-b. In some embodiments, fastening feature 416a-b extends through to a bottom surface of electronic device fastener 400, as shown in FIG. 8.

With reference to FIG. 8, fastening feature 416a-b for each corner retaining feature 402a-b can extend through to a bottom surface 802 of electronic device fastener 400 so that fastening feature 416a-b is exposed. This exposure allows a screw to extend through the interposer and into fastening feature 416a-b to fix electronic device fastener 400 to the interposer. As a screw hole, fastening feature 416a-b can be threaded for 3M (metric) or #4-40 (UNF). As further shown in FIG. 8, bottom surfaces of base 406a-b and base link bar 404 together can be coplanar and form bottom surface 802 of electronic device fastener 400.

Although the present disclosure has been described with respect to specific embodiments, it will be appreciated that the present disclosure is intended to cover all modifications and equivalents within the scope of the following claims.

What is claimed is:
1. An electronic device fastener, comprising:
a base link bar; and
a pair of corner retaining features coupled to the base link bar and forming a monolithic structure with the base link bar, wherein each corner retaining feature comprises:
a base being formed of a planar structure and having a base top surface having a base width;
a support rail extending from a portion of the base top surface and having a support rail top surface having a support rail width;
a fastening feature defined by surfaces of the base and support rail and comprising vacant space extending through the base and at least a portion of the support rail;

a guide wall extending from a portion of the support rail top surface;

a retaining protrusion extending from the guide wall toward a center line of the electronic device fastener, the retaining protrusion being positioned a first distance away from the support rail; and a stopper positioned beside the base link bar and at back ends of the base, the support rail, the guide wall, and the base link bar.

2. The electronic device fastener of claim 1, wherein the pair of corner retaining features are mirror images of one another, wherein the support rail top surface is coplanar with the base top surface and is at a first height away from base top surface.

3. The electronic device fastener of claim 1, wherein the retaining protrusion is positioned a second distance away from the stopper.

4. The electronic device fastener of claim 1, wherein a top surface of the retaining protrusion is coplanar with a top surface of the guide wall.

5. The electronic device fastener of claim 1, wherein the retaining protrusion includes a first width and a second width narrower than the first width so that the retaining protrusion has a tapered profile.

6. The electronic device fastener of claim 5, wherein the first width is for a region closest to the guide wall, and the second width is for a region farthest from the guide wall.

7. The electronic device fastener of claim 1, wherein the base width is different from the support rail width.

8. The electronic device fastener of claim 7, wherein the base width is greater than the support rail width.

9. The electronic device fastener of claim 1, wherein the fastening feature is a screw hole.

10. The electronic device fastener of claim 1, wherein the support rail top surface is substantially planar.

11. An electronic device system, comprising:
an interposer comprising:
an interposer substrate comprising at least two mounting holes; and
an interposer connector mounted on the interposer substrate;
an electronic device comprising:
an electronic device substrate comprising at least two recesses;
an electronic device connector mounted on the electronic device substrate, the electronic device connector configured to electrically couple with the interposer connector; and
an electronic device fastener mounted on the interposer substrate by way of the at least two mounting holes and configured to couple the electronic device to the interposer, the electronic device fastener comprising:
a base link bar; and
a pair of corner retaining features coupled to the base link bar and forming a monolithic structure with the base link bar, wherein each corner retaining feature comprises:
a base being formed of a planar structure and having a base top surface having a base width;

a support rail extending from a portion of the base top surface and having a support rail top surface having a support rail width;

a fastening feature defined by surfaces of the base and support rail and comprising vacant space extending through the base and at least a portion of the support rail;

a guide wall extending from a portion of the support rail top surface;

a retaining protrusion extending from the guide wall toward a center line of the electronic device fastener, the retaining protrusion being positioned a distance away from the support rail; and a stopper positioned beside the base link bar and at back ends of the base, the support rail, the guide wall, and the base link bar.

12. The electronic device fastener of claim 11, wherein the pair of corner retaining features are mirror images of one another.

13. The electronic device system of claim 11, wherein the retaining protrusion is positioned a second distance away from the stopper.

14. The electronic device system of claim 11, wherein a top surface of the retaining protrusion is coplanar with a top surface of the guide wall.

15. The electronic device system of claim 11, wherein the retaining protrusion includes a first width and a second width narrower than the first width so that the retaining protrusion has a tapered profile.

16. The electronic device system of claim 15, wherein the first width is for a region closest to the guide wall, and the second width is for a region farthest from the guide wall.

17. A method for connecting an electronic device to an interposer with an electronic device fastener, the method comprising:
contacting an electronic device connector to an interposer connector;
pressing the electronic device into a support rail of the electronic device fastener by having a recess of a substrate of the electronic device bypass a retaining feature of the electronic device fastener; and
sliding the electronic device along at least a portion of the support rail of the electronic device fastener to engage contact pins of the electronic device connector with contact pints of the interposer connector.

18. The method of claim 17, further comprising positioning the electronic device at an angle with respect to the interposer.

19. The method of claim 17, wherein pressing the electronic device into a support rail of the electronic device fastener positions the electronic device planar to the interposer so that the electronic device connector is aligned with the interposer connector.

20. The method of claim 17, wherein the electronic device is prevented from moving upward, downward, and side-to-side once the electronic device fastener is engaged with the interposer connector.

* * * * *